United States Patent
Krymski

(10) Patent No.: US 7,205,522 B2
(45) Date of Patent: Apr. 17, 2007

(54) PIXEL CIRCUIT FOR IMAGE SENSOR

(75) Inventor: Alexander Krymski, La Crescenta, CA (US)

(73) Assignee: Alexander Krymski D. B. A Alexima, Pasadena, CA (US)

( * ) Notice: Subject to any disclaimer, the term of this patent is extended or adjusted under 35 U.S.C. 154(b) by 43 days.

(21) Appl. No.: 11/132,496

(22) Filed: May 18, 2005

(65) Prior Publication Data

US 2006/0261246 A1    Nov. 23, 2006

(51) Int. Cl.
*H01L 27/00* (2006.01)
*H01J 40/14* (2006.01)

(52) U.S. Cl. .............................. 250/208.1; 250/214 R; 348/298; 348/308

(58) Field of Classification Search ............. 250/208.1, 250/214 R; 348/298–306, 308, 311–314
See application file for complete search history.

(56) References Cited

U.S. PATENT DOCUMENTS

| | | | |
|---|---|---|---|
| 5,898,168 A | 4/1999 | Gowda et al. | |
| 6,486,503 B1 | 11/2002 | Fossum | |
| 6,507,365 B1 | 1/2003 | Nakamura et al. | |
| 6,549,234 B1 | 4/2003 | Lee | |
| 6,555,842 B1 | 4/2003 | Fossum et al. | |
| 6,556,224 B1 | 4/2003 | Banno | |
| 6,590,611 B1 | 7/2003 | Ishida et al. | |
| 6,624,456 B2 | 9/2003 | Fossum et al. | |
| 6,630,957 B1 | 10/2003 | Kuroda et al. | |
| 6,667,768 B1 | 12/2003 | Fossum | |
| 6,720,592 B1 | 4/2004 | Kindt et al. | |
| 6,741,283 B1 | 5/2004 | Merrill et al. | |
| 6,809,767 B1 | 10/2004 | Kozlowski et al. | |
| 6,825,059 B2 | 11/2004 | Fossum | |
| 6,975,356 B1* | 12/2005 | Miyamoto | 348/308 |
| 7,045,754 B2* | 5/2006 | Manabe et al. | 250/208.1 |
| 2006/0007329 A1* | 1/2006 | Panicacci | 348/241 |

OTHER PUBLICATIONS

Alexander I. Krymski and Nianrong Tu, "A 9-V/LUX-S 5000-Frames/S 512 + 512 CMOS Sensor," IEEE Transactions on Electron Devices, vol. 50, No. 1 Jan. 2003.
S. Seshadri, G. Yang, M. Ortiz, C. Wrigley and B. Pain, "CMOS Difference Imager With Charge-Leakage Compensation & Sum Output," Submitted to the 2001 IEEE Workshop on CCDs and Advanced Image Sensors, Jun. 7-9, 2001, Lake Tahoe.
Guang Yang, Orly Yadid-Pecht, Chris Wrigley and Bedabrata Pain, "A Snap-Shot CMOS Active Pixel Imager for Low-Noise, High-Speed Imaging," Jet Propulsion Laboratory, California Institute of Technology, Pasadena, California.
International Search Report from PCT application PCT/US06/17563 dated Oct. 5, 2006.

* cited by examiner

*Primary Examiner*—Stephone B. Allen
*Assistant Examiner*—Patrick J. Lee
(74) *Attorney, Agent, or Firm*—Foley & Lardner LLP

(57) ABSTRACT

A pixel circuit for an image sensor uses a common reset transistor for resetting both of a photodiode node and a memory node. Respective transfer gates connect the common reset transistor to the photodiode node and to the memory node, and connect photodiode node and the memory node to each other. A source follower enabled with a row select gate provides a readout signal from the memory node. The use of the common reset transistor and the operational timing of the circuit elements improves fixed pattern noise arising from transistor feedthroughs in the pixel circuit.

20 Claims, 10 Drawing Sheets

Period 0

Period 1

Period 2

Period 3

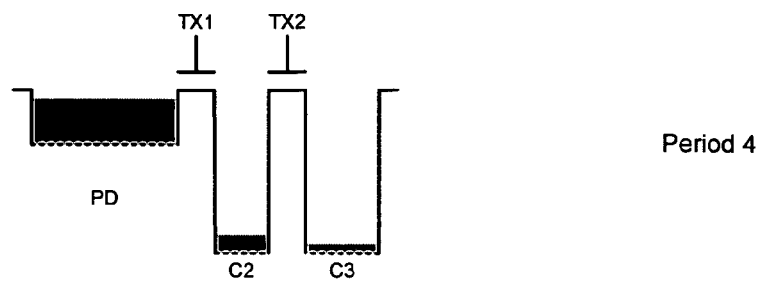
Figure 10  Period 4
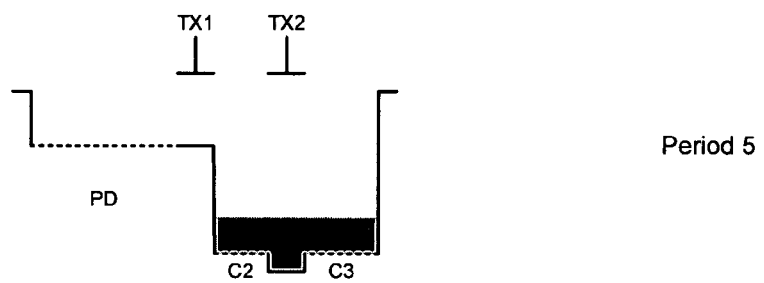
Figure 11  Period 5
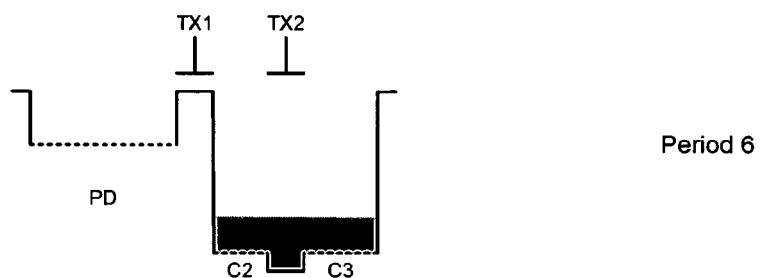
Figure 12  Period 6
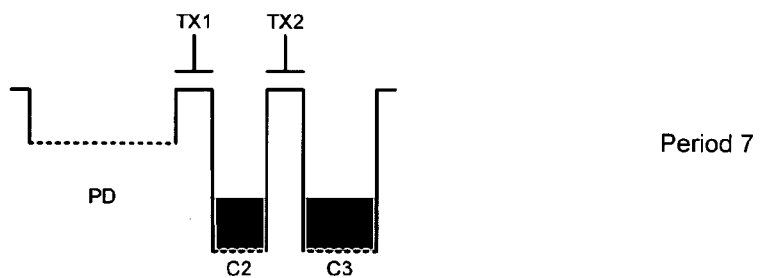
Figure 13  Period 7

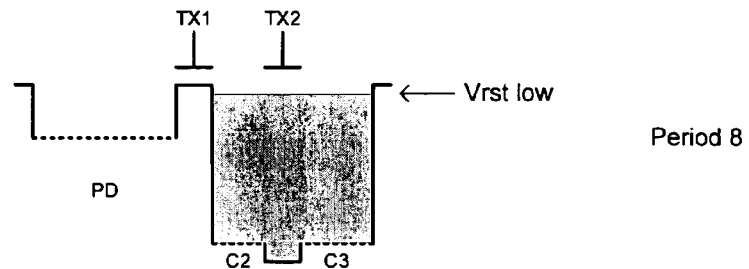
Figure 14 — Period 8
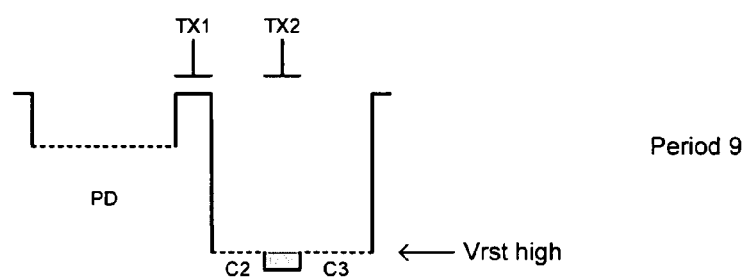
Figure 15 — Period 9
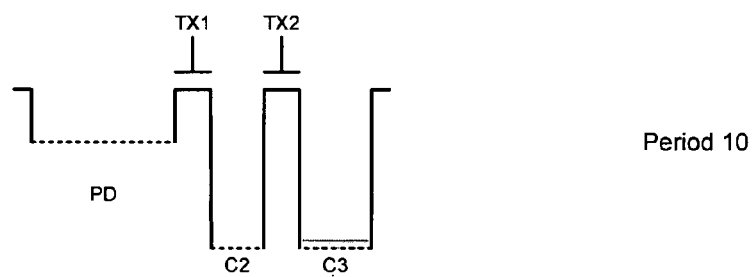
Figure 16 — Period 10
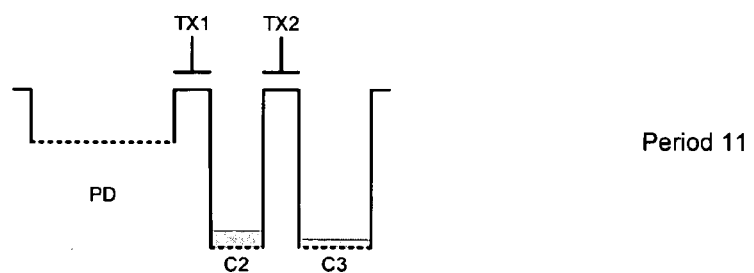
Figure 17 — Period 11

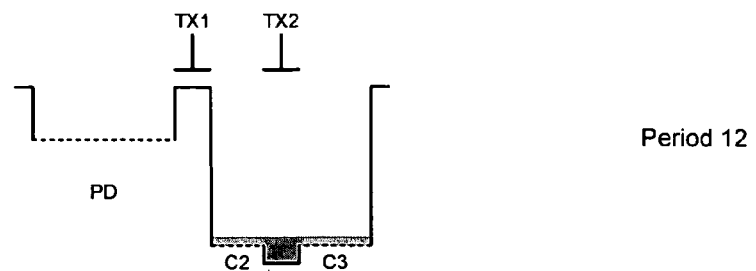
Figure 18  Period 12
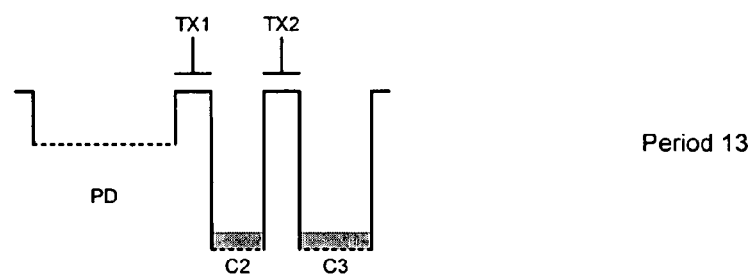
Figure 19  Period 13
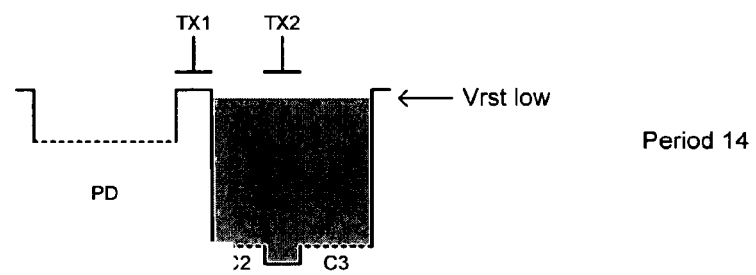
Figure 20  Period 14
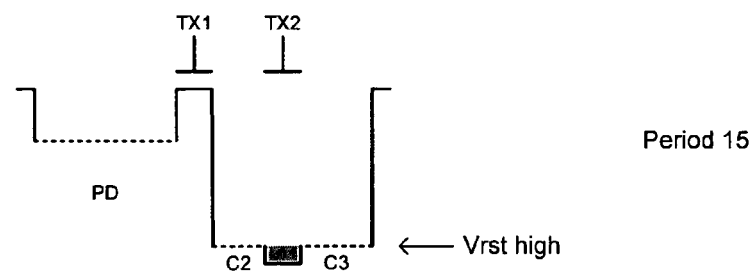
Figure 21  Period 15

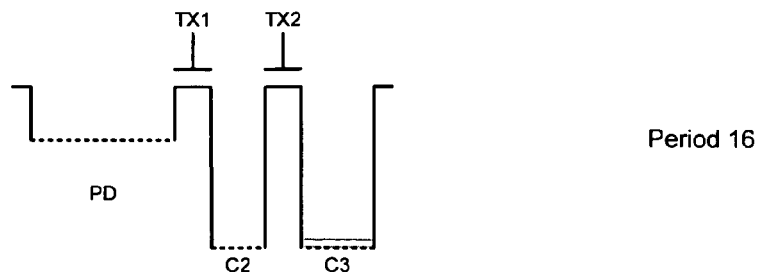
Figure 22  Period 16
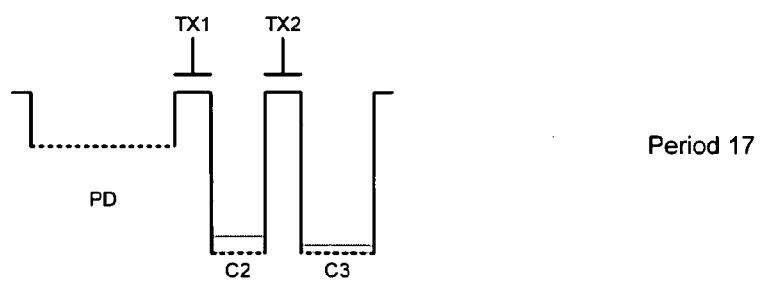
Figure 23  Period 17
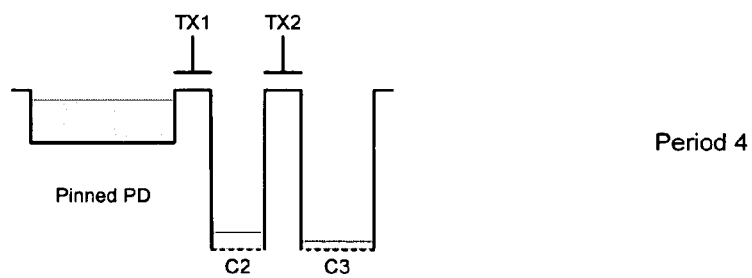
Figure 24  Period 4
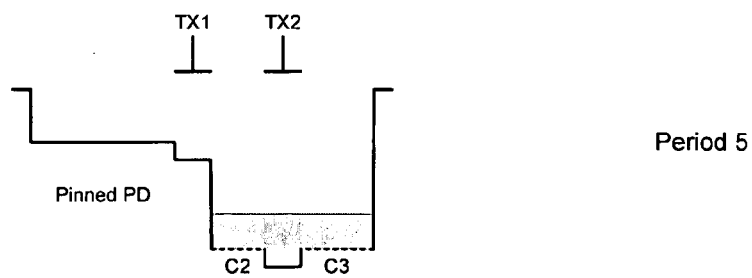
Figure 25  Period 5

PIXEL CIRCUIT FOR IMAGE SENSOR

BACKGROUND

1. Field of the Invention

Embodiments of the invention relate to image sensors, and particularly to CMOS image sensors that perform simultaneous image sampling for all rows of pixels in the imaging array.

2. Related Technology

A simplified architecture of a CMOS image sensor is shown in FIG. 1. The image sensor is comprised of a two dimensional array of pixel circuits 110 that sample portions of an image. A row driver circuit 112 supplies control signals in common to the pixel circuits 110 in each row of the array. Pixel circuits 110 in each column provide pixel values in the form of analog voltages to column amplifiers 114, which drive the inputs of column AD converters 116 operating under the control of an ADC controller 118. Digital pixel values are supplied from the AD converters 116 to a RAM 120 having parallel inputs for each column. Pixel values are supplied to the RAM 120 on a row-by-row basis. In alternative embodiments, separate RAMs with associated ADCs and column amplifiers may be provided above and below the pixel array, with each RAM receiving data from odd or even columns of the pixel array.

Various methods of image sampling and readout control may be implemented. In one implementation referred to as a "rolling shutter," the sampling period for each row of pixels begins after the signals from its previous sampling period have been read out to the column amplifiers 114. Rolling shutter image sensors based on a four-transistor pixel structure and pinned photodiode exhibit low noise and high sensitivity, and are the dominant image sensor for a majority of consumer applications. However the rolling shutter method is undesirable for use in high-speed moving image applications since the sampling period of each row is offset in time from that of the next row, thus introducing row to row motion artifacts into the resulting image.

An alternative to the rolling shutter method is a parallel sampling method in which all pixels sample the image during the same time period and then output the sampled signals row by row. FIG. 2 shows an example of a pixel circuit in a conventional CMOS image sensor that performs parallel sampling. During exposure, a photodiode 122 produces photocurrent which is integrated to produce a charge at the photodiode node 124. The storage capacity of the photodiode node 124 is shown in broken lines as an equivalent capacitance 126. When exposure is completed, the accumulated charge is transferred from the photodiode node 124 to a memory node 128 through a transfer gate 130. The transfer gate 130 is implemented as a MOSFET, and the capacitance 132 of the MOSFET source/drain serves as a memory element for storing the charge. After transfer of the accumulated charge, the photodiode node 124 is reset through application of a reset voltage Vrst through a photodiode reset gate 134.

Operation of a row select gate 136 causes a signal to be read out onto a column line 138 through a source follower 140 that is powered by a driving voltage Vdd and that has its gate connected to the memory node 128. Signals from the column line are supplied to a column amplifier 142. The column amplifier 142 is implemented as a differential amplifier that outputs the difference of an image signal voltage read from the column line 138 and a reset signal voltage subsequently read from the column line 138. A charge stored in the memory node 128 is used to generate each of these voltages. The image signal voltage corresponds to the charge transferred from the photodiode node 124 to the memory node 128. The reset signal voltage corresponds to a charge stored in the memory node 128 after application of the reset voltage Vrst to the memory node 128 through a memory reset gate 144. At the column amplifier 142, the image signal voltage is stored in a signal storage element 146 controlled by a gate 148, and a subsequent reset signal voltage is stored in a reset storage element 150 controlled by a gate 152. The storage elements 146 and 150 may be implemented as capacitors.

FIG. 3 provides a timing diagram showing gate control signals provided by the row driver 12 of FIG. 1 to the pixel circuit of FIG. 2 and operations resulting from those control signals. The operations include global operations that cause image exposure at all pixels, and single row operations that cause all pixels of an individual row to be read out in parallel. For purposes of illustration, the timing diagram of FIG. 3 shows all global operations, followed by single row operations for the first row of pixels to be read out. However, as will be discussed below, the global operations may overlap the single row operations.

The global operations include a photodiode (PD) reset, during which the photodiode reset gates 134 of all pixels in the array are opened to reset the values stored in the photodiode nodes 124 through application of the reset voltage Vrst. After the photodiode reset operation is completed, image exposure occurs, during which all pixel circuits are exposed to light and generate photocurrent that is integrated to create charges representing pixel values of an image. A transfer operation then occurs, during which the transfer gates 130 of all pixel circuits are opened to transfer the charges accumulated in the photodiode nodes 124 to the corresponding memory nodes 128.

The single row operations for a given row begin with an image signal readout operation, during which the row select gates 136 of all pixel circuits in the row are opened to read image signals corresponding to the charges stored in the pixel circuit memory nodes 128 onto the corresponding column lines 138. During the image signal readout operation a control signal SH_S causes image signal voltages on the column lines to be stored in image signal storage elements 146 at the inputs of the column amplifiers 142. After the image signal readout operation is complete, a memory reset operation is performed, during which the memory reset gates 144 are opened to apply the reset voltage Vrst to the memory nodes 128. After the memory reset operation is complete, a reset signal readout operation occurs, during which the row select gates 136 are opened to read reset signal voltages corresponding to the reset charges stored in the memory nodes 128 onto the corresponding column lines. During this operation a control signal SH_R causes the reset signal voltages on the column lines 138 to be stored in the reset signal storage elements 150 at the inputs of the column amplifiers 142. Upon completion of this operation, each column amplifier 142 of the array outputs a voltage representing the difference between the signal voltage and the reset voltage of a respective pixel in the row. These voltages are supplied as inputs to AD converters to generate respective digital pixel values. The illustrated series of single row operations is repeated for each successive row of the pixel array to read out all pixels of the pixel array.

From the timing of FIG. 3 it is seen that the transfer gate remains closed during all single row operations, thus isolating the photodiode node from the single row operations. A new exposure period may therefore begin at any time after the transfer gate is closed, allowing an image to be exposed while pixel values of the preceding image are being read out. The breaks in the control signals of FIG. 3 during the global operations period are provided to illustrate that single row operations may occur during the exposure period between the photodiode reset operation and the transfer operation.

Certain disadvantages are experienced with the pixel circuit of the type shown in FIG. 2. The feedthrough of the photodiode reset gate 134 is a function of the photodiode node 124 equivalent capacitance, and the feedthrough of the memory reset gate 144 is a function of the memory node 128 capacitance. The gate feedthrough is manifested as a difference between the reset voltage Vrst and the voltage at the photodiode node 124 or memory node 128 after application of the reset voltage Vrst through the respective gate. The differences in the feedthroughs of the photodiode reset gate 134 and the memory reset gate 144 yield different voltages after reset at the photodiode node 124 and memory node 128 as a result of charge injected into those node upon closing the respective gates. The transfer gate 130 feedthrough also affects the voltage transferred from the photodiode node 124 to the memory node 128. These feedthrough values are a function of a number of parameters including device geometries, threshold voltages and others, and are different at each pixel circuit. Consequently, while the effects of feedthrough at each pixel are essentially constant from cycle to cycle, the signal produced by each pixel circuit includes a feedthrough component that is different at each pixel. This produces "fixed pattern noise" or dark signal nonuniformity in the sampled image. The magnitude of the dark signal nonuniformity in an image sensor having pixel circuits of the type shown in FIG. 2 may be in the range of 30 mV peak-to-peak.

SUMMARY

A pixel circuit for an image sensor uses a common reset transistor for resetting both of a photodiode node and a memory node. Respective transfer gates connect the common reset transistor to the photodiode node and to the memory node, and connect photodiode node and the memory node to each other. A source follower enabled with a row select gate provides a readout signal from the memory node. The use of the common reset transistor and the operational timing of the circuit elements improves fixed pattern noise arising from transistor feedthroughs in the pixel circuit.

In accordance with one embodiment of the invention, a pixel circuit for an image sensor includes a photodiode connected to a photodiode node, a first transfer transistor connected between the photodiode node and an intermediate node, a second transfer transistor connected between the intermediate node and a memory node, and a reset transistor connected between a reset voltage line and the intermediate node. In another embodiment of the invention, pixel circuits of this type may be implemented in a pixel circuit array of an image sensor.

In accordance with another embodiment of the invention, a pixel circuit is operated by applying the reset voltage to a photodiode node through a reset transistor and a first transfer transistor to reset the photodiode node, exposing the photodiode to accumulate charge at the photodiode node, transferring charge from the photodiode node to a memory node through the first transfer transistor and a second transfer transistor, reading out an image signal generated from charge at the memory node, applying the reset voltage to the memory node through the reset transistor and the second transfer transistor to reset the memory node a first time, reading out a reset signal generated from charge at the memory node, and applying the reset voltage to the memory node through the reset transistor and the second transfer transistor to reset the memory node a second time. In another embodiment of the invention, control signals may be supplied from a row driver of an image sensor to control the operations of pixel circuits in this manner.

In accordance with another embodiment of the invention, a pixel circuit may be operated by resetting a photodiode node by applying a reset voltage to the photodiode node through a reset transistor, exposing a photodiode to accumulate charge at the photodiode node, transferring charge from the photodiode node to a memory node, reading out an image signal generated from charge at the memory node, resetting the memory node a first time by applying a reset voltage to the memory node through the reset transistor, and reading out a reset signal generated from charge at the memory node. In another embodiment of the invention, control signals may be supplied from a row driver of an image sensor to control the operations of pixel circuits in this manner.

DESCRIPTION OF THE DRAWINGS

FIGS. 6, 7, 8, 9, 10, 11, 12, 13, 14, 15, 16, 17, 18, 19, 20, 21, 22 and 23 show charges present at nodes of the circuit of FIG. 4 at instances corresponding to time periods illustrated in FIG. 5.

FIGS. 24 and 25 show charges present at nodes of the circuit of FIG. 4 at instances corresponding to time periods illustrated in FIG. 5 in an alternative implementation of the circuit of FIG. 4 using a pinned photodiode.

DETAILED DESCRIPTION

Figure 4:
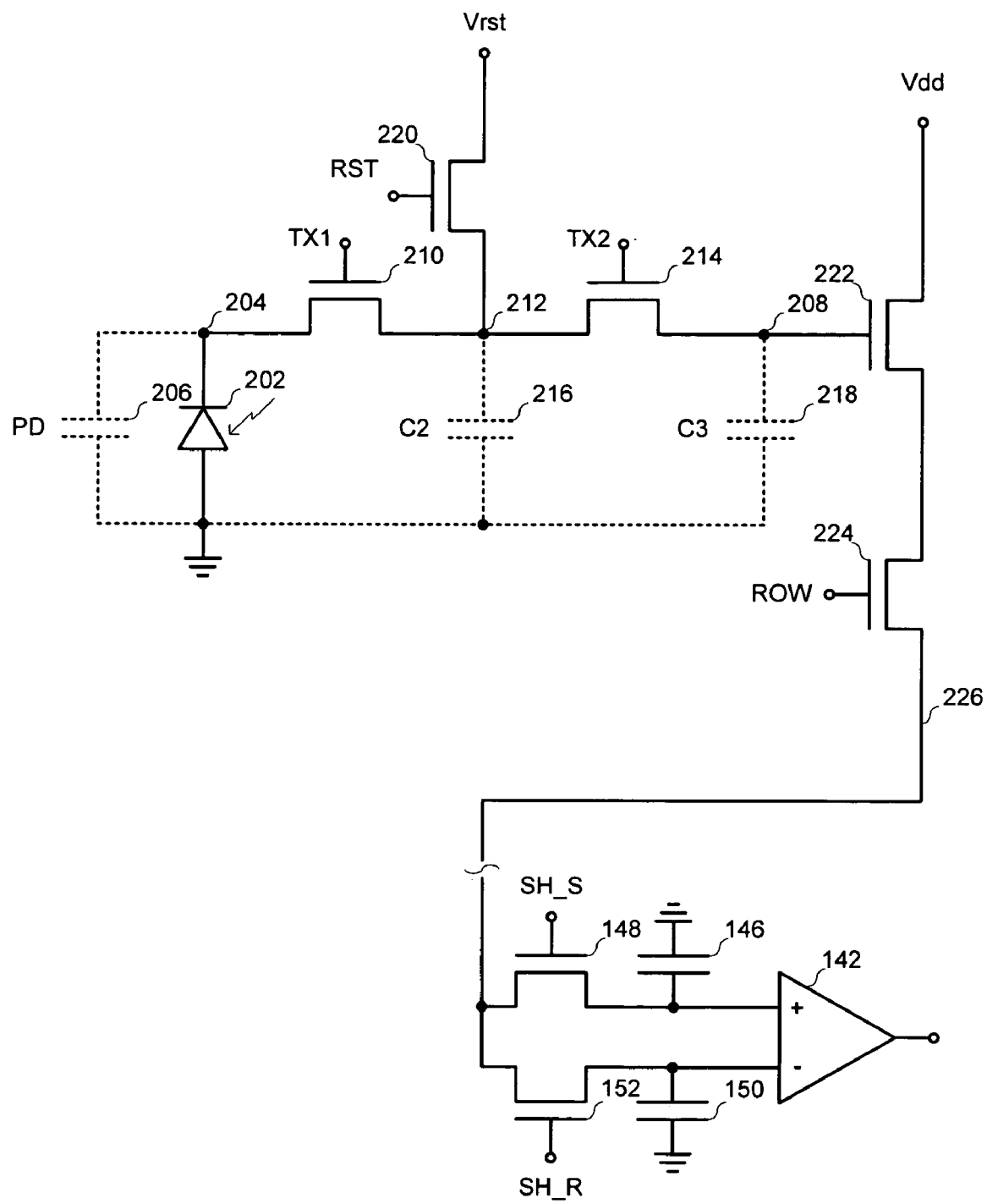
FIG. 4 shows a pixel circuit of an image sensor in accordance with an embodiment of the invention.

FIG. 4 shows a first embodiment of pixel circuit in accordance with the invention. In general terms the embodiment of FIG. 4 is a five transistor pixel circuit that uses a common reset gate for resetting both a photodiode node and a memory node.

The circuit of FIG. 4 includes a photodiode 202 connected to a photodiode node 204. The photodiode node 204 has an equivalent capacitance 206. Charge is transferred from the photodiode node 204 to a memory node 208 through a first transfer gate 210 connected between the photodiode node 204 and an intermediate node 212, and a second transfer gate 214 connected between the intermediate node 212 and the memory node 208. The intermediate node 212 has an equivalent capacitance 216 and the memory node has an equivalent capacitance 218. The first transfer gate 210 and the second transfer gate 214 are preferably implemented as MOSFETs having a common diffusion that serves as the source of the first transfer gate 210 and the drain of the second transfer gate 214. The common diffusion provides the capacitance 216 of the intermediate node 212. A source diffusion of the second transfer gate 214 provides the capacitance 218 of the memory node 208. It is preferred that the capacitance 216 of the intermediate node 212 is minimized while the capacitance 218 of the memory node 208 is maximized, and it is further preferred that the capacitance 218 of the memory node 208 is matched to the capacitance 206 of the photodiode node 204.

A reset gate 220 controls the application of a reset voltage Vrst to the intermediate node 212. The reset gate 220 is preferably implemented as a MOSFET sharing a common diffusion with the first transfer gate 210 and the second transfer gate 214. The reset voltage may be applied to the photodiode node 204 through the first transfer gate 210, and may be applied to the memory node 208 through the second transfer gate 214.

Figure 2:
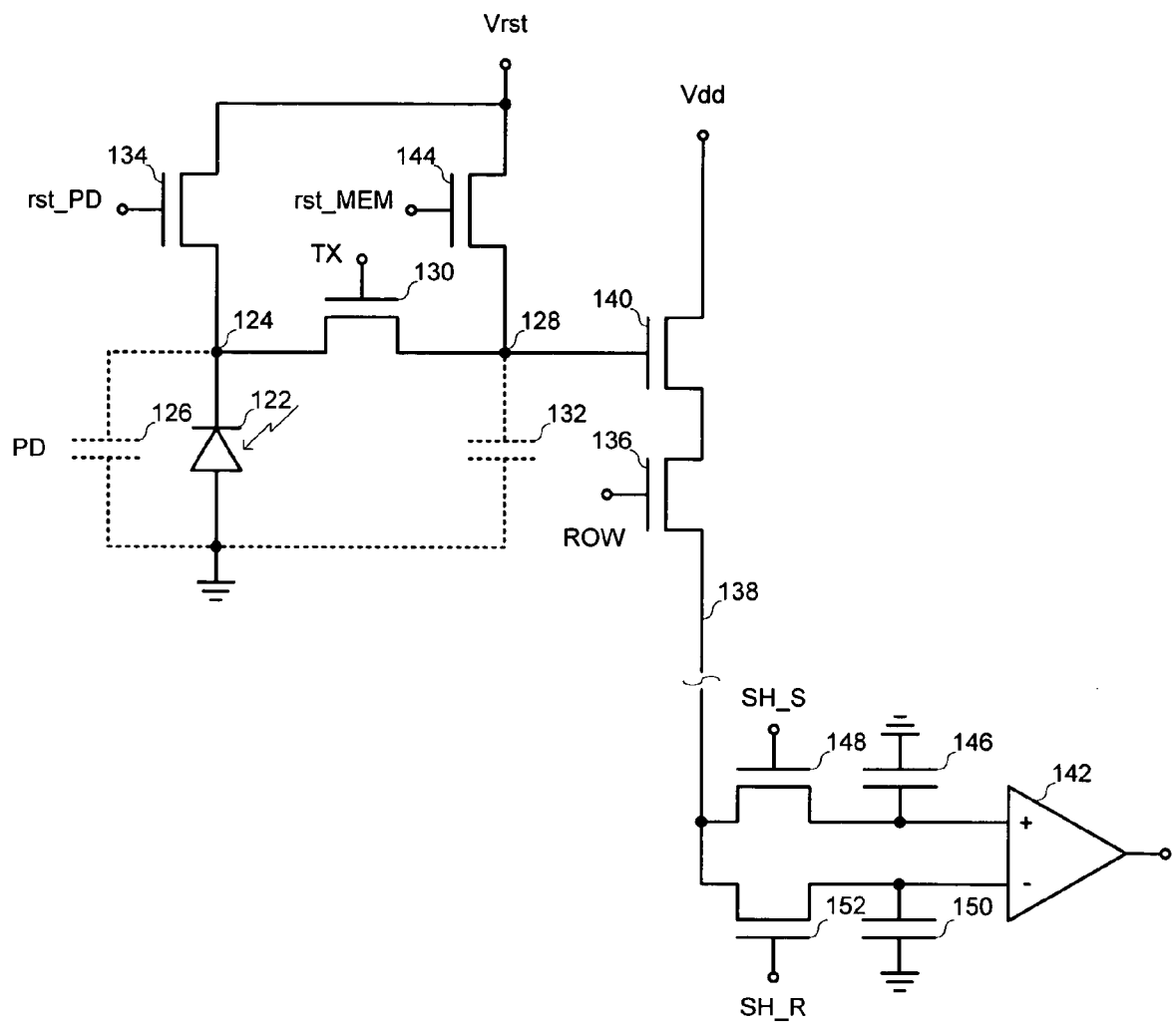
FIG. 2 shows a conventional pixel circuit of a CMOS image sensor.
Figure 3:
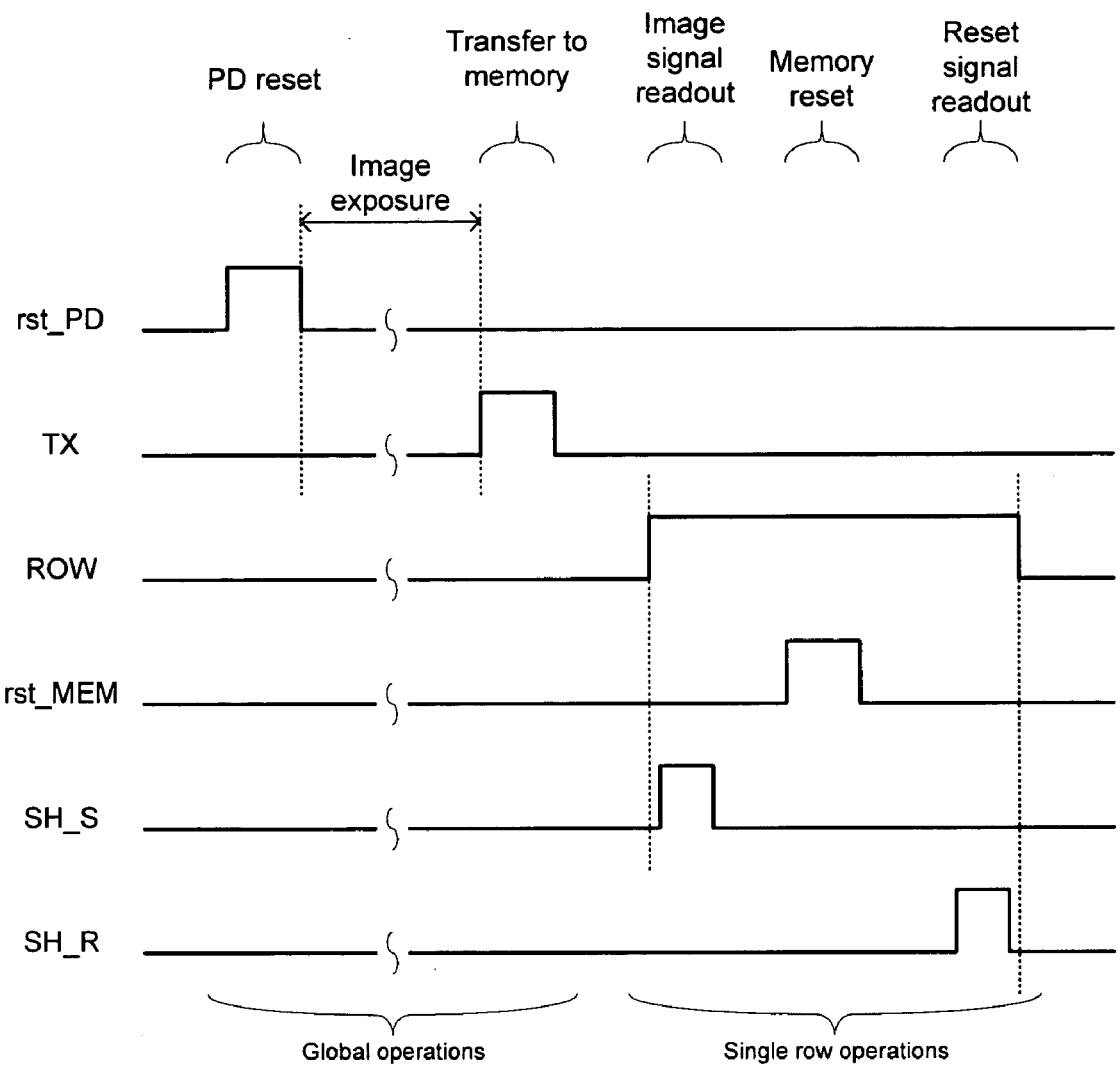
FIG. 3 shows a timing diagram for the pixel circuit of FIG. 2.

A source follower 222 and a row select gate 224 are provided for reading image and reset signals from the memory node 208 onto a column line 226. The column line 226 supplies image signal voltages and reset signal voltages to a differential amplifier of the type shown in FIG. 2.

Figure 5:
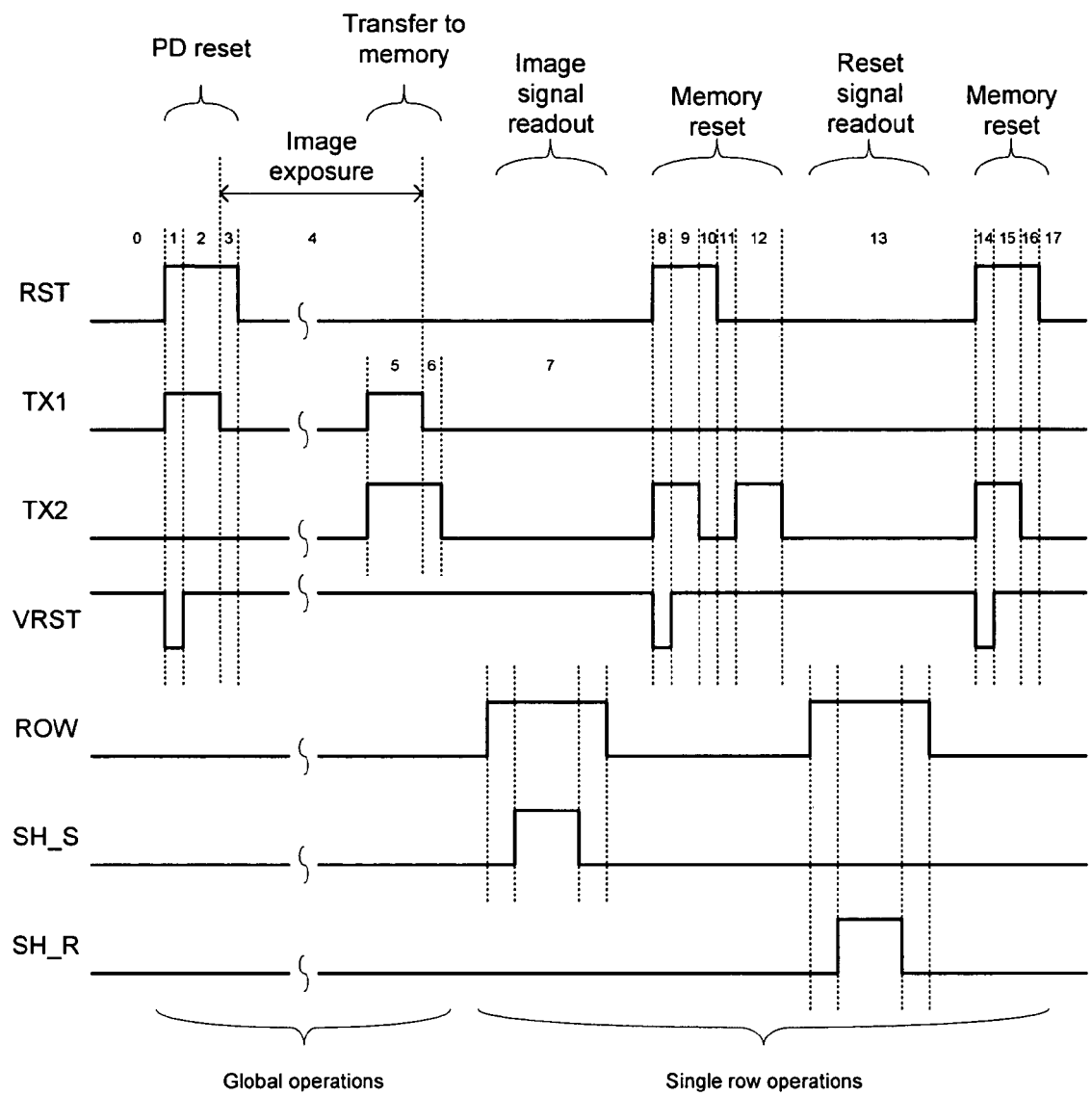
FIG. 5 shows a timing diagram for the pixel circuit of FIG. 4.

Operation of the circuit of FIG. 4 is now described with reference to the timing diagram of FIG. 5 which shows control signals supplied to the pixel circuit gates from a row driver circuit 112 and corresponding operations in the pixel circuit, and which further shows states of the reset voltage Vrst during these operations. The circuit operations include global operations that cause image exposure at all pixels, and single row operations that cause all pixels of an individual row to be read out in parallel. For purposes of illustration, the timing diagram of FIG. 5 shows all global operations, followed by single row operations for the first row of pixels to be read out. However, as will be discussed below, the global operations may overlap the single row operations.

The global operations portion begins with a photodiode reset operation, during which the reset voltage Vrst is applied to the photodiode node 204 by opening the reset gate 220 and the first transfer gate 210. A brief inversion of the reset voltage state is provided at the beginning of the photodiode reset operation to "flush" the photodiode node so as to remove any residual memory of charge accumulated during the preceding exposure period. An image exposure period begins upon closing of the first transfer gate 210. During image exposure, photocurrent is integrated at the photodiode node 204, causing an accumulation of charge. A transfer operation subsequently transfers this charge to the memory node 208 by opening the first transfer gate 210 and the second transfer gate 214.

Single row operations begin with an image signal readout operation, during which the row select gate 224 is opened to read an image signal voltage onto the column line 226. During this operation the image signal value storage element control gate 148 is also opened to store the image signal voltage at the column amplifier 142. A memory reset operation is then performed, during which the reset gate 220 and the second transfer gate 214 are opened to apply the reset voltage Vrst to the memory node 208. A flush of the memory node 208 is performed by a brief inversion of the reset voltage state at the beginning of this operation. In contrast to the prior art circuit of FIG. 2, it is preferred to close the row select gate before performing the memory reset operation, since the open row select gate will influence the capacitance of the memory node 208 and thus cause the capacitance 218 of the memory node 208 to have a value during the memory reset operation that is different than its value during the transfer operation.

After closing the reset gate 220 and the second transfer gate 214, the second transfer gate 214 is opened a second time to equalize potentials at the memory node 208 and the intermediate node 212 caused by charge injection. A reset signal readout operation is then performed, during which the row select gate 224 is opened to read a reset signal voltage onto the column line 226. During this operation the reset signal value storage element control gate 152 is also opened to store the reset signal voltage at the column amplifier 142. Following reset signal readout operation, a second memory reset operation is performed by opening the reset gate 220 and the second transfer gate 214 to apply the reset voltage Vrst to the memory node 208. A flush of the memory node 208 is again performed by a brief inversion of the reset voltage state at the beginning of this operation. Again, it is preferred that the row select gate 224 is closed before performing the memory reset operation.

From the timing of FIG. 5 it is seen that the first transfer gate 210 remains closed during all single row operations, thus isolating the photodiode node 204 from the effects of the single row operations. Consequently a new exposure period may begin at any time after the first transfer gate 210 is closed, allowing an image to be exposed while pixel values of the preceding image are being read out. The breaks in the control signals of FIG. 5 during the global operations period are provided to illustrate that single row operations may occur during the exposure period between the photodiode reset operation and the transfer operation. The timing of the photodiode reset operation and exposure period may be varied as a function of imaging parameters such as light levels.

Figure 6:
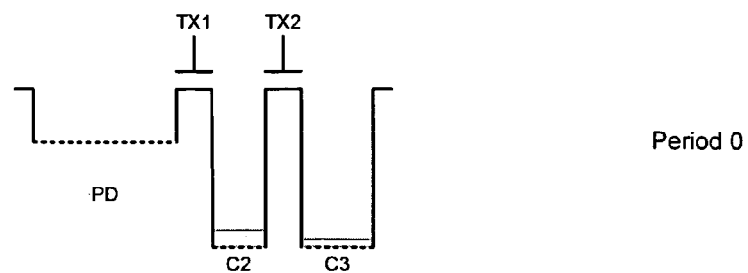

Further explanation of the operations shown in FIG. 5 are provided with reference to FIGS. 6–23, which show charge storage in the circuit of FIG. 4 during the time periods 0 through 19 illustrated in FIG. 5. In these figures, lines represent barriers to the movement of charge, gray space represents charge, and empty space represents the relative absence of charge. For example, referring to FIG. 6, the empty space in the region above PD represents the absence of charge at the photodiode node 204, the gray space above C2 represents a small amount of charge at the intermediate node 212, and the gray space above C3 represents a small amount of charge at the memory node 208. The structures located beneath TX1 and TX2 represent barriers to movement of charge that correspond to the states of the first transfer gate 210 and the second transfer gate 214, respectively. In FIG. 6, both transfer gates are closed, and thus serve as barriers to movement of charge between the photodiode node PD, the intermediate node C2, and the memory node C3.

FIG. 6 shows the circuit of FIG. 4 at time period 0 of FIG. 5. Time period 0 generally corresponds to time period 17 of FIG. 5, by which time the photodiode PD, the intermediate node C2 and the memory node C3 have been reset and effectively emptied of charge. The presence of residual charge shown in FIG. 6 will be addressed in the discussion of FIG. 23 and time period 17.

Figure 7:
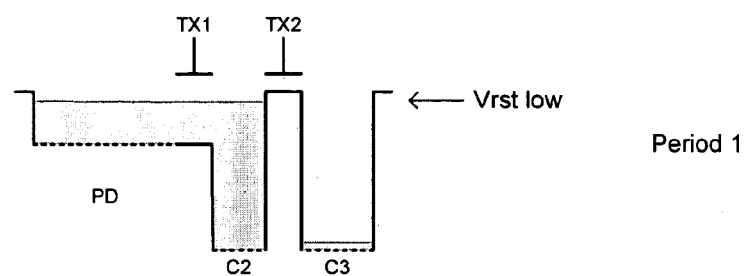
Figure 8:
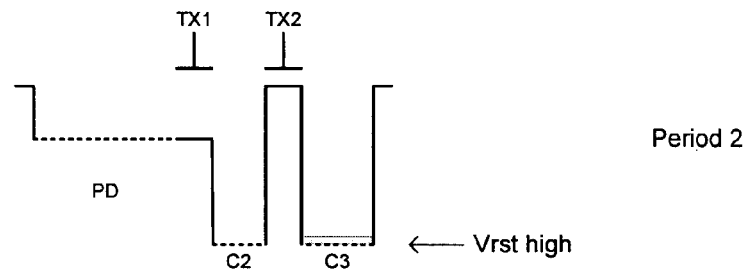
Figure 9:
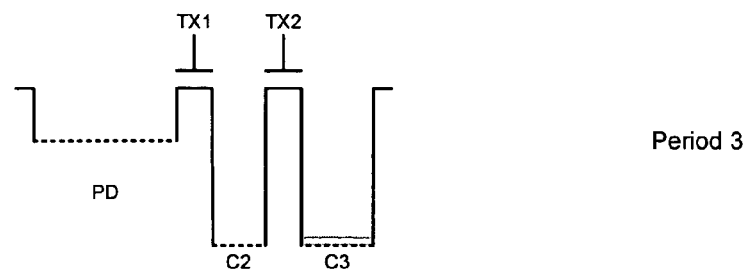

FIGS. 7 through 9 illustrate the photodiode reset operation. FIG. 7 shows the circuit of FIG. 4 at time period 1 of FIG. 5. During this time period, the reset gate RST and the first transfer gate TX1 are opened, and the reset voltage Vrst is brought low, thus filling the photodiode node PD and intermediate node C2 with charge. For purposes of illustrating the operation of the circuit, the effective "bottom" of the photodiode node PD is shown as being the same as the open voltage of the first transfer gate TX1. The open voltage of the first transfer gate TX1 should not be too high, and is typically in the range of 1.0 to 1.5 V. During time period 1 the second transfer gate TX2 is closed, and so there is no appreciable effect on the memory node C3. FIG. 8 corresponds to time period 2 during which the reset voltage Vrst is high, causing charge to be drained from the photodiode node PD and the intermediate node C2. For purposes of illustrating the operation of the circuit, the effective "bottoms" of the intermediate node C2 and the memory node C3 are shown as being the same as the high reset voltage Vrst. By filling the photodiode node PD and the intermediate node C2 with charge (FIG. 7) prior to draining charge from those nodes (FIG. 8), any memory of the charge present in those nodes prior to reset is eliminated. FIG. 9 corresponds to time period 3 during which the first transfer gate TX1 is closed. This series of operations resets the photodiode node PD and intermediate node C2 to an essentially charge-free reset state.

FIG. 10 illustrates the image exposure operation. FIG. 10 corresponds to period 4, during which charge is accumulated at the photodiode node PD. The additional charge shown accumulated in the intermediate node C2 is charge that is injected at C2 by the closing of the reset gate RST at the end of the photodiode reset operation.

FIGS. 11 through 13 illustrate the transfer operation. FIG. 11 corresponds to period 5, during which the first transfer gate TX1 and the second transfer gate TX2 are both opened, causing charge to be transferred to the intermediate node C2 and the memory node C3 from the photodiode node PD. All charge from the photodiode node PD at a voltage less than the open voltage of the first transfer gate TX1 (shown in FIG. 11 as the level to which the TX1 barrier falls when open) is drawn into the higher voltage intermediate node C2 and memory node C3 (shown in FIG. 11 by the lower level of the bottoms of C2 and C3). This method of operation is more efficient than simply shorting the photodiode PD to the intermediate node C2 and the memory node C3, which would result in the transfer of less charge to the memory node C3. It is noted that the barrier of the second transfer gate TX2 is made lower than the high reset voltage (represented by the bottoms of the nodes C2 and C3) during this operation. This ensures that the second transfer gate TX2 does not operate in a weak inversion mode of operation with high sensitivity to threshold voltage variations. The operations shown in FIGS. 10 and 11 may be referred to as a "fill and spill" operation.

FIG. 12 corresponds to period 6, during which the first transfer gate TX1 is closed to terminate the transfer of charge from the photodiode PD. This ends the exposure period of the pixel. FIG. 13 corresponds to period 7, during which the second transfer gate TX2 is closed to isolate the memory node C3 from the intermediate node C2. During this state an image signal derived from the charge stored in the memory node C3 may be read out onto the column line.

FIGS. 14 through 19 illustrate the first memory reset operation. FIG. 14 corresponds to period 8, during which the first transfer gate TX1 is closed, the second transfer gate TX2 is open, and the reset gate RST is open, thus applying a low reset voltage Vrst to the intermediate node C2 and the memory node C3 to fill both nodes with charge. FIG. 15 corresponds to period 9, during which the reset voltage Vrst returns to high, causing charge to be drained from the intermediate node C2 and the memory node C3. FIG. 16 corresponds to period 10, during which the second transfer gate TX2 is closed, thereby isolating the memory node C3 from the intermediate node C2. The closing of the second transfer gate TX2 causes a small amount of charge to be injected into the memory node C3. FIG. 17 corresponds to period 11, during which the reset gate RST is closed. The closing of the reset gate RST results in the injection of a small amount of charge into the intermediate node C2. FIG. 18 corresponds to period 12, during which the second transfer gate TX2 is opened to balance any potential difference between the intermediate node C2 and the memory node C3 caused by charge injection into those nodes. FIG. 19 corresponds to period 13, during which the second transfer gate TX2 is closed again, thus isolating the memory node C3 from the intermediate node C2. During this state a reset signal derived from the charge stored in the memory node C3 may be read out onto the column line.

FIGS. 20 through 23 show the second memory reset operation. FIG. 20 corresponds to period 14, during which the first transfer gate TX1 is closed, the second transfer gate TX2 is open, and the reset gate RST is open, thus applying a low reset voltage Vrst to the intermediate node C2 and the memory node C3 to fill both nodes with charge. FIG. 21 corresponds to period 15, during which the reset voltage Vrst returns to high, causing charge to be drained from the intermediate node C2 and the memory node C3. FIG. 22 corresponds to period 16, during which the second transfer gate TX2 is closed, thereby isolating the memory node C3 from the intermediate node C2. The closing of the second transfer gate TX2 causes a small amount of charge to be injected into the memory node C3. FIG. 23 corresponds to period 17, during which the reset gate RST is closed. The closing of the reset gate RST results in the injection of a small amount of charge into the intermediate node C2. The charges injected during periods 16 and 17 are those seen at the intermediate node C2 and memory node C3 at period 0 as illustrated in FIG. 6.

The manner in which feedthrough-related fixed pattern noise is reduced by the circuit of FIG. 4 and the control of FIG. 5 can be summarized as follows. The cumulative effects of feedthrough on the reset signal are caused by the reset gate RST and the second transfer gate TX2 (period 9), then by the reset gate RST (period 10), then by the second transfer gate TX2 (period 12), then by the reset signal storage control gate SH_R. Similarly, the cumulative effects of feedthrough on the image signal are caused by the reset gate RST and the second transfer gate TX2 (period 15), then by the reset gate RST (period 16), then by the second transfer gate TX2 (period 6), then by the image signal storage control gate SH_S. Consequently, while the parameters affecting feedthrough may differ at each pixel circuit, the feedthrough effects on the image signal and reset signal of each pixel are approximately the same and will be removed by the column line differential amplifier.

While the circuit of FIG. 4 assumes the use of a regular N$^-$/P-substrate photodiode, an alternative circuit may utilize a pinned photodiode. The controls applied to such a circuit are essentially the same as those shown in FIG. 5, however the high level of the control signal provided to the first transfer gate 210 is chosen with reference to properties of the pinned photodiode. The diagrams of FIGS. 24 and 25 illustrate this principle. FIG. 24 shows the circuit at time period 4, during which image exposure occurs. In this figure, the "bottom" of the pinned photodiode node is shown in a solid line to represent a high voltage point corresponding to the full depletion of the pinned photodiode. FIG. 25 shows the same circuit during time period 5, during which the first transfer gate TX1 and the second transfer gate TX2 are opened to transfer charge from the pinned photodiode node to the intermediate node C2 and memory node C3. As shown in FIG. 25, the open gate voltage of the first transfer gate TX1 is higher than the depletion voltage of the pinned photodiode, thus enabling all charge to be drawn out of the pinned photodiode.

Figure 1:
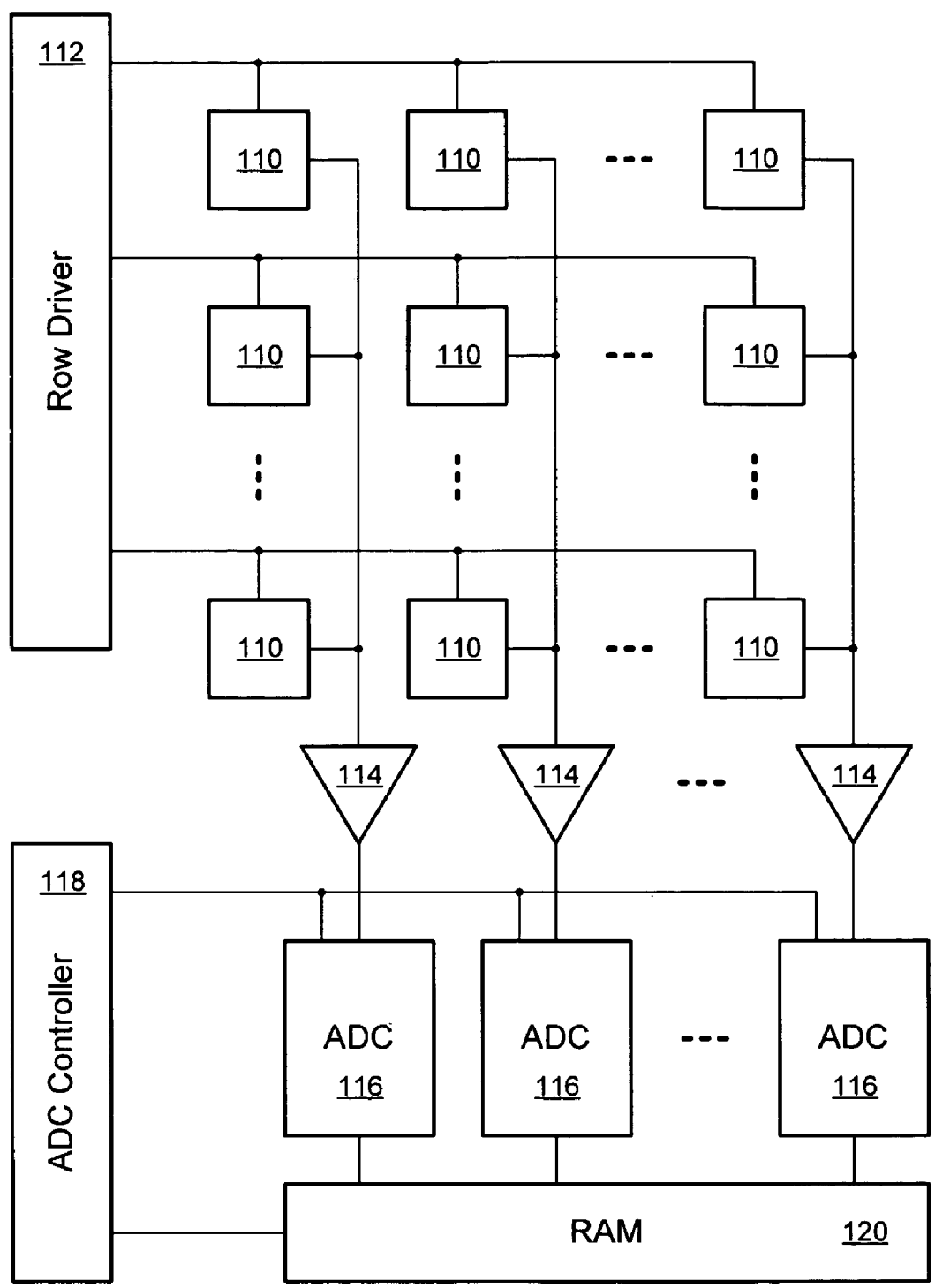
FIG. 1 is a high level view of a conventional CMOS image sensor architecture.

The embodiment of the pixel circuit described herein may be implemented in an image sensor architecture such as that of FIG. 1 or in alternative architectures. Control signals of the type shown in FIG. 5 may be supplied by a row driver containing appropriate logic for generating signals with the illustrated states and timing. Such image sensors may be used in a variety of imaging devices for purposes including still and video imaging.

The circuits, devices, features and processes described herein are not exclusive of other circuits, devices, features and processes, and variations and additions may be implemented in accordance with the particular objectives to be achieved. For example, while the preferred embodiment illustrates circuit elements as being directly connected, in alternative embodiments, additional elements may be connected between the illustrated elements without disrupting the passage of signals among the illustrated elements as described herein. Further, circuits as described herein may be integrated with other circuits not described herein to provide further combinations of features, to operate concurrently within the same devices, or to serve other purposes. Thus it should be understood that the embodiments illustrated in the figures and described above are offered by way of example only. The invention is not limited to a particular embodiment, but extends to various modifications, combinations, and permutations that fall within the scope of the claims and their equivalents.

What is claimed is:

1. A pixel circuit for an image sensor comprising:
   a photodiode connected to a photodiode node;
   a first transfer transistor connected between the photodiode node and an intermediate node;
   a second transfer transistor connected between the intermediate node and a memory node;
   a reset transistor connected between a reset voltage line and the intermediate node;
   a source follower transistor having its gate connected to the memory node and having its drain connected to a driving voltage line; and
   a row select transistor having its drain connected to the source of the source follower transistor and having its source connected to a column line.

2. The pixel circuit claimed in claim 1, wherein the photodiode is a pinned photodiode.

3. The pixel circuit claimed in claim 1, wherein the memory node has a capacitance provided by a source diffusion of the second transfer transistor.

4. The pixel circuit claimed in claim 1, wherein the first transfer transistor source and the second transfer transistor drain share a common diffusion that serves as said intermediate node.

5. An image sensor circuit comprising:
   an array of pixels comprised of rows and columns of pixel circuits;
   a row driver connected to supply respective control signals to rows of said pixel circuits; and
   respective analog to digital converters connected to receive signals produced by columns of said pixel circuits;
   wherein each of said pixel circuits comprises:
   a photodiode connected to a photodiode node;
   a first transfer transistor connected between the photodiode node and an intermediate node;
   a second transfer transistor connected between the intermediate node and a memory node;
   a reset transistor connected between a reset voltage line and the intermediate node;
   a source follower transistor having its gate connected to the memory node and having its drain connected to a driving voltage line; and
   a row select transistor having its drain connected to the source of the source follower transistor and having its source connected to a column line.

6. The image sensor circuit claimed in claim 5, wherein the photodiode of each pixel circuit is a pinned photodiode.

7. The image sensor circuit claimed in claim 5, wherein the memory node has a capacitance provided by a source diffusion of the second transfer transistor.

8. The image sensor circuit claimed in claim 5, wherein the first transfer transistor source and the second transfer transistor drain share a common diffusion that serves as said intermediate node.

9. The image sensor circuit claimed in claim 5, wherein the image sensor further comprises:
   a respective differential amplifier connected to receive a signal from a respective column line of the image sensor, each differential amplifier having a first input for receiving an image signal from a pixel circuit and a second input for receiving a reset signal from the pixel circuit.

10. A method for operating a pixel circuit of an image sensor, the pixel circuit comprising a photodiode connected to a photodiode node, a first transfer transistor connected between the photodiode node and an intermediate node, a second transfer transistor connected between the intermediate node and a memory node, and a reset transistor connected between a reset voltage line and the intermediate node, the method comprising:
    applying the reset voltage to the photodiode node through the reset transistor and the first transfer transistor to reset the photodiode node;
    exposing the photodiode to accumulate charge at the photodiode node;
    transferring charge from the photodiode node to the memory node through the first transfer transistor and the second transfer transistor;
    reading out an image signal generated from charge at the memory node;
    applying the reset voltage to the memory node through the reset transistor and the second transfer transistor to reset the memory node a first time;
    reading out a reset signal generated from charge at the memory node; and
    applying the reset voltage to the memory node through the reset transistor and the second transfer transistor to reset the memory node a second time.

11. The method claimed in claim 10, wherein resetting the photodiode node comprises:
    applying a first reset voltage to the photodiode node through the reset transistor and the first transfer transistor to introduce charge into the photodiode node;
    applying a second reset voltage to the photodiode node through the reset transistor and the first transfer transistor to withdraw charge from the photodiode node; and
    closing the first transfer transistor.

12. The method claimed in claim 10, wherein exposing the photodiode to accumulate charge at the photodiode node and reading out said image signal and said reset signal occur simultaneously.

13. The method claimed in claim 10, wherein resetting the memory node the first time comprises:
    applying a first reset voltage to the intermediate node and the memory node through the reset transistor and the second transfer transistor to introduce charge into the intermediate node and the memory node;

applying a second reset voltage to the intermediate node and the memory node through the reset transistor and the second transfer transistor to withdraw charge from the intermediate node and the memory node;

closing the second transfer transistor;

closing the reset transistor;

opening the second transfer transistor; and closing the second transfer transistor.

14. The method claimed in claim 10, wherein resetting the memory node the second time comprises:

applying a first reset voltage to the intermediate node and the memory node through the reset transistor and the second transfer transistor to introduce charge into the intermediate node and the memory node;

applying a second reset voltage to the intermediate node and the memory node through the reset transistor and the second transfer transistor to withdraw charge from the intermediate node and the memory node;

closing the second transfer transistor;

closing the reset transistor.

15. A method for operating a pixel circuit of an image sensor, comprising:

resetting a photodiode node by applying a reset voltage to the photodiode node through a reset transistor and a first transfer transistor;

exposing a photodiode to accumulate charge at the photodiode node;

transferring charge from the photodiode node to a memory node through the first source transistor and a second transfer transistor;

reading out an image signal generated from charge at the memory node through a source follower transistor having its ate connected to the memory node and having its drain connected to a driving voltage line;

resetting the memory node a first time by applying a reset voltage to the memory node through the reset transistor and the second transfer transistor; and reading out a reset signal generated from charge at the memory node through the source follower transistor.

16. The method claimed in claim 15, further comprising resetting the memory node a second time after reading out the reset signal.

17. The method claimed in claim 15, wherein resetting the photodiode node comprises:

applying a low reset voltage to the photodiode node through the reset transistor to introduce charge into the photodiode node; and applying a high reset voltage to the photodiode node through the reset transistor to withdraw charge from the photodiode node.

18. The method claimed in claim 15, wherein exposing the photodiode to accumulate charge at the photodiode node and reading out said image signal and said reset signal occur simultaneously.

19. The method claimed in claim 15, wherein resetting the memory node the first time comprises:

applying a first reset voltage to the memory node through the reset transistor to introduce charge into the memory node; and applying a second reset voltage to the memory node through the reset transistor to withdraw charge from the memory node.

20. The method claimed in claim 15, wherein resetting the memory node the second time comprises:

applying a first reset voltage to the memory node through the reset transistor to introduce charge into the memory node; and applying a second reset voltage to the memory node through the reset transistor to withdraw charge from the memory node.

* * * * *